United States Patent [19]

Blair

[11] Patent Number: 4,603,322
[45] Date of Patent: Jul. 29, 1986

[54] HIGH-SPEED SEQUENTIAL SERIAL MANCHESTER DECODER

[75] Inventor: James L. Blair, San Diego, Calif.
[73] Assignee: Cubic Corporation, San Diego, Calif.
[21] Appl. No.: 424,226
[22] Filed: Sep. 27, 1982
[51] Int. Cl.[4] ............................................ H03M 13/24
[52] U.S. Cl. ................................ 340/347 DD; 375/87
[58] Field of Search ............ 360/42, 43; 346/347 DD; 375/55, 87

[56] References Cited

U.S. PATENT DOCUMENTS

| | | | |
|---|---|---|---|
| 3,185,931 | 5/1965 | Collins | 329/103 |
| 3,491,202 | 1/1970 | Bailey et al. | 178/88 |
| 3,659,286 | 4/1972 | Perkins et al. | 340/347 |
| 3,705,398 | 12/1972 | Kostenbauer et al. | 340/347 |
| 3,731,293 | 5/1973 | McFiggans | 360/42 |
| 3,787,826 | 1/1974 | Norris | 340/174.1 |
| 3,800,227 | 3/1974 | Kobayashi | 325/320 |
| 3,820,031 | 6/1974 | Smithlin | 340/347 DD |
| 3,836,956 | 9/1974 | Cross | 340/146.1 |
| 3,863,025 | 1/1975 | Gonsewski et al. | 178/69.5 |
| 3,916,084 | 10/1975 | Toole | 178/69.5 |
| 3,938,082 | 2/1976 | Schowe, Jr. | 340/146.1 |
| 3,953,674 | 4/1976 | Fletcher et al. | 178/69.5 |
| 3,967,061 | 6/1976 | Dobias | 178/69.5 |
| 3,979,746 | 9/1976 | Jarrett | 340/347 |
| 4,080,572 | 3/1978 | Hastings et al. | 325/321 |
| 4,088,832 | 5/1978 | Eastmond | 178/69.1 |
| 4,122,383 | 9/1978 | Burgert | 329/50 |
| 4,122,441 | 10/1978 | Robinson et al. | 340/146.1 |
| 4,130,802 | 12/1978 | Nossen et al. | 325/30 |
| 4,167,760 | 9/1979 | Decker | 360/40 |
| 4,185,273 | 1/1980 | Gowan | 340/347 |
| 4,222,116 | 9/1980 | Groves | 375/55 |
| 4,241,398 | 12/1980 | Carll | 364/200 |
| 4,242,755 | 12/1980 | Gauzan | 375/114 |
| 4,302,845 | 11/1981 | McClaughry et al. | 375/82 |
| 4,317,211 | 2/1982 | Quesnell, Jr. | 375/87 |
| 4,322,850 | 3/1982 | Antonini et al. | 375/81 |
| 4,361,895 | 11/1982 | Khouddri | 375/87 |

OTHER PUBLICATIONS

Erickson et al., *IBM Technical Disclosure Bulletin*, "Half-Frequency Decoder," 7-78, pp. 807-808.

Primary Examiner—John W. Caldwell, Sr.
Assistant Examiner—Donna L. Angotti
Attorney, Agent, or Firm—Brown, Martin & Haller

[57] ABSTRACT

An incoming serial Manchester signal is synchronously sampled by a first flip-flop with respect to a reference clock signal of a frequency $f_o$. A second flip-flop divides the reference clock signal to provide $f_o/2$ clocking to a pair of shift registers wherein one shift register is of bit length M and the other is of bit length N. The first flip-flop provides to the first shift register a present sample corresponding to the state of the Manchester waveform. A third flip-flop samples and stores the state of the Manchester waveform sample, as provided by the first flip-flop, which occurred one-half clock period prior to the $f_o/2$ clocking of the shift registers. The third flip-flop provides to the second shift register a delayed sample corresponding to the state of the Manchester waveform. The sample provided to the second shift register is a sample which occurred previously in time, by $1/f_o$ clock period, relative to the present sample provided to the first shift register. Sample pairs are stored and shifted at the rate of $f_o/2$ while a sampling rate of $f_o$ is achieved. As a result, the interval over which the sample at each register bit output remains stable is increased, thereby enabling the use of a sequential decoding technique. The outputs of the two shift registers are interleaved, and tied to the inputs of a programmable gate array, to synthesize a single shift register of bit length M+N. State machine Boolean expressions encoded into the gate array are utilized to sequentially recover data, clock and gap signals and to facilitate self-test diagnostics.

21 Claims, 5 Drawing Figures

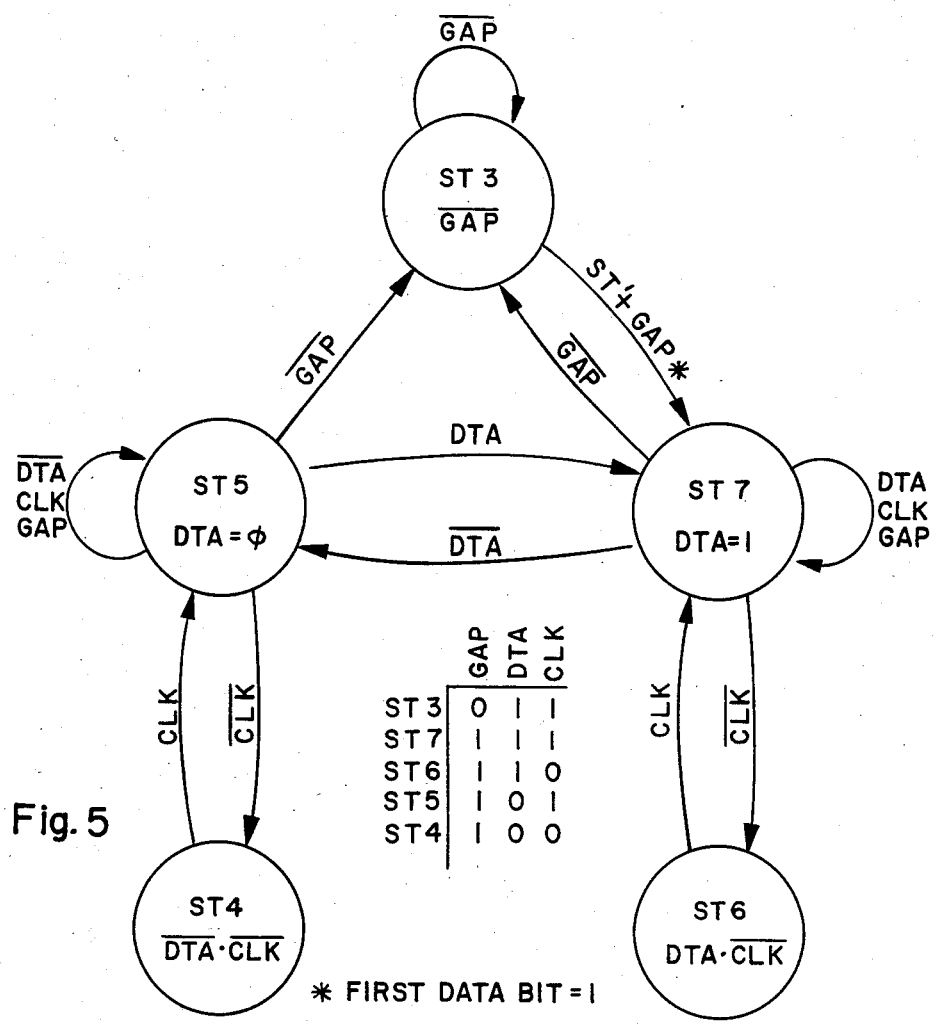

HIGH-SPEED SEQUENTIAL SERIAL MANCHESTER DECODER

BACKGROUND OF THE INVENTION

The present invention relates to the transmission of data in binary form serially through an information channel, and more particularly, to an apparatus for decoding Manchester encoded data.

In transmitting serial digital data, it is necessary to provide a series of clock pulses in addition to the data in order to synchronize the coding of the transmitted serial data at the receiving terminal. Prior transmitting schemes have required two channels, one for data, and one for clock. To avoid the need for two channels, and to eliminate certain difficulties in magnetic recording of serial data, self-clocking codes were developed which combined data and clock signals.

The Manchester code is one self-clocking code. Manchester encoders accept clock and data signals and combine them into a single output which may then be transmitted via a single channel to the receiving terminal. When the self-clocking data signal arrives at the receiving terminal, it is processed by a Manchester decoder which separately extracts the data and clock signals.

Prior Manchester decoders have in many cases required extensive circuitry. Furthermore, the speed of prior Manchester decoders has been limited by speed limitations of the solid state components they have utilized.

SUMMARY OF THE INVENTION

It is therefore the primary object of the present invention to provide an improved Manchester decoder which utilizes fewer components.

Another object of the present invention is to provide a Manchester decoder which is capable of processing at half the sampling rate.

Still another object of the present invention is to provide a Manchester decoder which utilizes a programmable gate array logic integrated circuit having Boolean expressions encoded therein.

Yet another object of the present invention is to provide a Manchester decoder that utilizes a sequential state machine approach.

Another object of the present invention is to provide a Manchester decoder which generates a gap signal to indicate when the data transmission is over.

Finally, another object of the present invention is to provide a Manchester decoder having a self-testing diagnostic feature.

Accordingly, the present invention provides a decoder in which an incoming serial Manchester signal is synchronously sampled by a first flip-flop with respect to a reference clock signal of a frequency $f_o$. A second flip-flop divides the reference clock signal to provide $f_o/2$ clocking to a pair of shift registers wherein one shift register is of bit length M and the other is of bit length N. The first flip-flop provides to the first shift register a present sample corresponding to the state of the Manchester waveform. A third flip-flop samples and stores the state of the Manchester waveform sample, as provided by the first flip-flop, which occurred one-half clock period prior to the $f_o/2$ clocking of the shift registers. The third flip-flop provides to the second shift register a delayed sample corresponding to the state of the Manchester waveform. The sample provided to the second shift register is a sample which occurred previously in time, by $1/f_o$ clock period, relative to the present sample provide to the first shift register. Sample pairs are stored and shifted at the rate of $f_o/2$ while a sampling rate of $f_o$ is achieved. As a result, the interval over which the sample at each register bit output remains stable is increased, thereby enabling the use of a sequential decoding technique. The outputs of the two shift registers are interleaved, and tied to the input of a programmable gate array, to synthesize a single shift register of bit length M+N. State machine Boolean expressions encoded into the gate array are utilized to sequentially recover data, clock and gap signals and to facilitate self-test diagnostics.

BRIEF DESCRIPTION OF THE DRAWINGS

FIG. 4 is a table of the bit patterns used by the gate array of the preferred embodiment to analyze the Manchester waveform.

FIG. 5 is a state diagram illustrating the decision making sequence of the gate array of the preferred embodiment through the Boolean expressions encoded therein.

DESCRIPTION OF THE PREFERRED EMBODIMENT

The preferred embodiment of my high speed sequential serial Manchester decoder circuit which is described and illustrated herein is adapted for decoding Manchester biphase level signals encoded in accordance with MIL-STD-1553A as amended Apr. 30, 1975. That military standard specifies that a logic one shall be transmitted as a bipolar coded signal 1/0, i.e., a positive pulse followed by a negative pulse. It further specifies that a logic zero shall be transmitted as a bipolar coded signal 0/1, i.e., a negative pulse followed by a positive pulse. According to this military standard, a transition through zero occurs at the midpoint of each bit time. In the preferred embodiment of my decoder, the bit rate of the Manchester signal is six megahertz.

Figure 1:
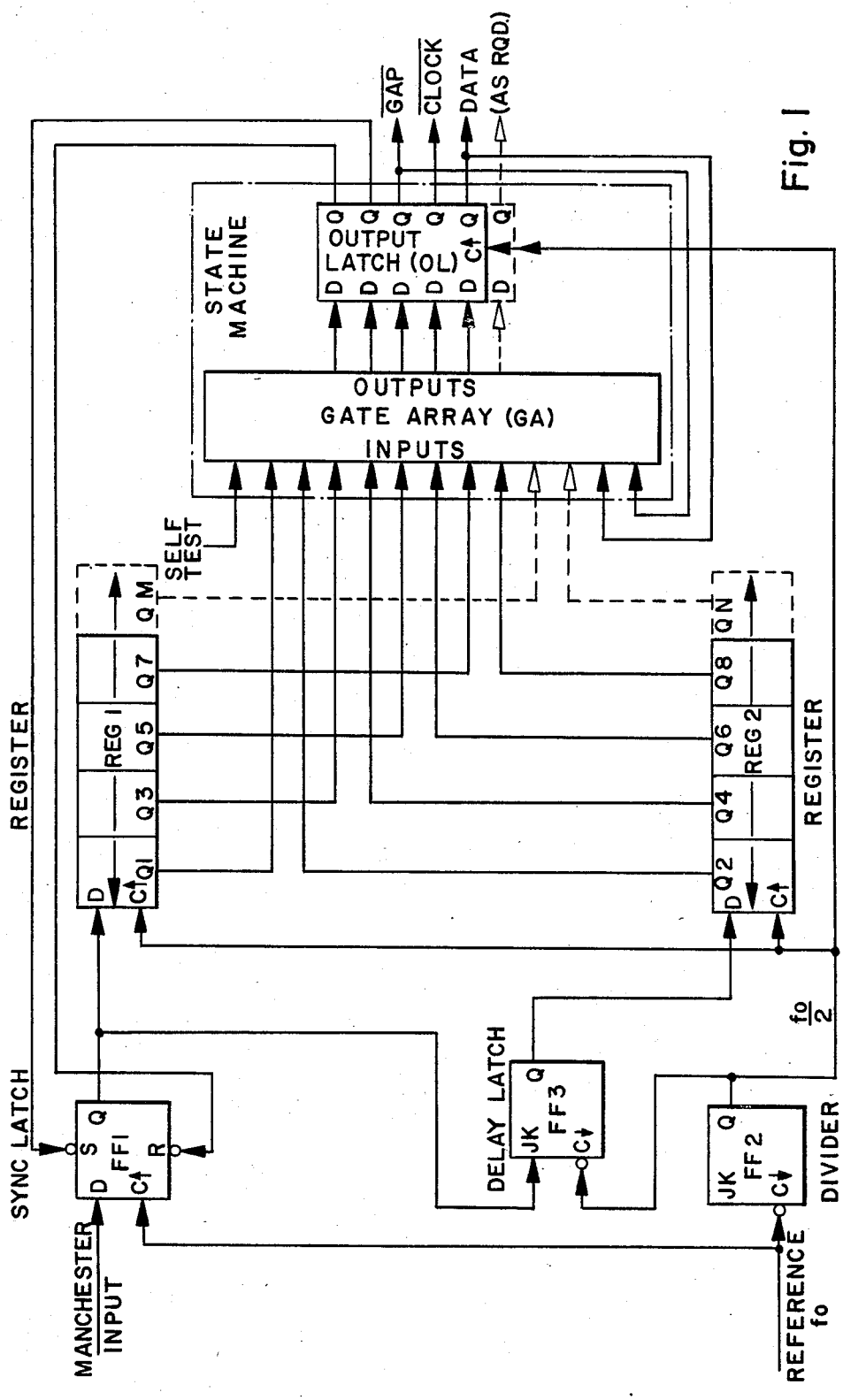
FIG. 1 is a functional block diagram of a preferred embodiment of my Manchester decoder.

Referring to the block diagram of FIG. 1, the preferred embodiment of my decoder has a D type flip-flop FF1 which functions as a waveform sampling and synchronizing latch, a J/K type flip-flop FF2 which functions as a divider, and a J/K type flip-flop FF3 which functions as a sample delay latch. The flip-flop FF1 is provided by one-half of a 54S74 chip (integrated circuit), the two halves of which chip are separately denoted in FIG. 2 as S74. The flip-flops FF2 and FF3 (FIG. 1) are provided by a 54S112 chip, the two halves of which chip are separately denoted in FIG. 2 as S112.

Figure 2:
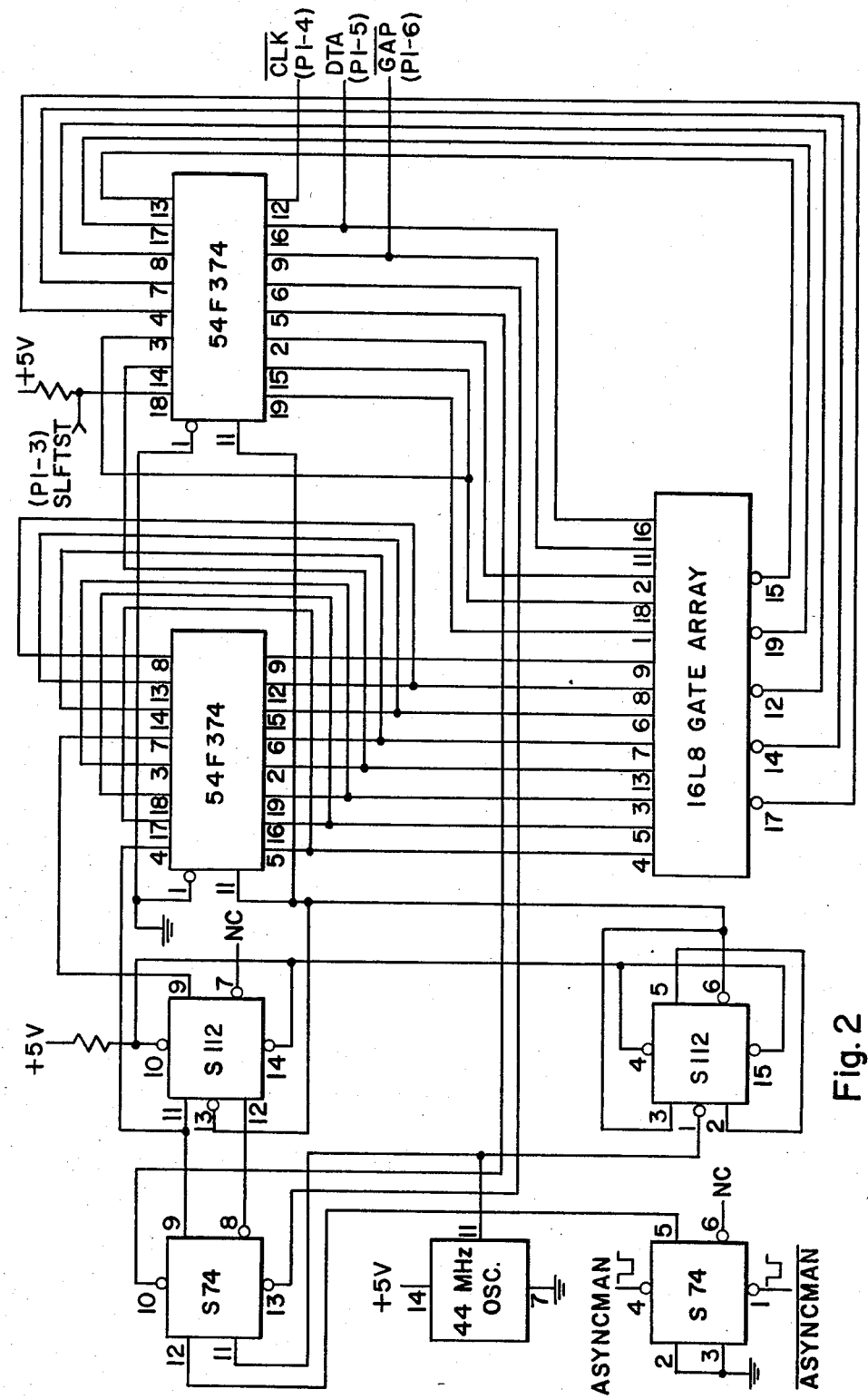
FIG. 2 is a schematic diagram of the preferred embodiment.

The preferred embodiment further includes a shift register of a length M+N which is divided into parts denoted in FIG. 1 as REG 1 and REG 2. In the preferred embodiment, the registers are provided by a pair of 54F374 octal latch chips (FIG. 2) which are externally connected to operate in the manner of shift registers. The outputs of REG 1 and REG 2 are interleaved, and tied to the inputs of a gate array GA (FIG. 1), to synthesize a single register of bit length M+N. In the preferred embodiment, the gate array is provided by a 16L8 programmable logic array chip (FIG. 2). The outputs of the gate array are connected through an output latch OL (FIG. 1) to provide state storage and diagnostic feedback control to flip-flop FF1. The output latch is provided by the portion of the right 54F374 chip (FIG. 2) which is not utilized in forming shift register REG 2. The gate array GA and the output latch OL together comprise what is referred to herein as a "state machine".

As is conventional, the asynchronous Manchester signal is carried in analog form to the decoder and is coupled into the decoder via a terminating transformer (not illustrated). The transformer provides signals to two transistor gain stages (not illustrated) whose outputs, ASYNCMAN and $\overline{\text{ASYNCMAN}}$, are in complement to each other and are respectively fed to pins 1 and 4 of the lower S74 flip-flop in FIG. 2. This flip-flop converts the inputs at pins 1 and 4 to a single ended NRZ TTL compatible waveform on pin 5.

A 44 Megahertz reference clock signal $f_o$ (FIG. 3) is generated by an external stable crystal oscillator OSC (FIG. 2) on pin 11 and is applied to pin 11 of the upper S74 flip-flop. The TTL compatible Manchester signal from the lower S74 flip-flop is applied to pin 12 of the upper S74 flip-flop. At this point, the Manchester waveform at pin 12 of the upper S74 flip-flop is asynchronous to the 44 Megahertz clock signal. When the positive going edge of the 44 Megahertz clock signal makes a low to high transition, the state of the Manchester waveform at pin 12 of the upper S74 flip-flop is sampled and is transferred to pin 9 and the complement to pin 8 of the upper S74 flip-flop.

The 44 Megahertz clock signal is also applied to pin 1 of the lower S112 flip-flop (FIG. 2) which divides the clock signal and provides a 22 Megahertz clock signal (FIG. 3) at pin 6 (FIG. 2) of this flip-flop. This 22 Megahertz signal is applied to pin 13 of the upper S112 flip-flop and to pin 11 of both of the 54F374 shift registers. The sample rate of the circuit is 44 Megahertz and the processing rate of the Manchester signal is at 22 Megahertz. Therefore, upper S112 flip-flop stores the state or sense of the synchronous Manchester waveform presented at the outputs provided at pins 9 and 8 of the upper S74 flip-flop, midway between the positive edges of the 22 Megahertz clock signal (see FIG. 3).

REG 2 (FIG. 1) is formed by the Q outputs of the left 54F374 chip (FIG. 2) pins 6, 15, 12 and 9. REG 1 (FIG. 1) is formed by the Q outputs at pins 5, 16, 19, and 2 on the left 54F374 chip (FIG. 2) and on the right 54F374 chip, pins 15 and 2. REG 2 is fed by pin 9 of the upper S112. REG 1 is in parallel with the upper S112 input. At the occurrence of each positive edge of the 22 Megahertz clock signal, REG 1 and REG 2 simultaneously store their respective samples of the synchronous Manchester waveform. The data presented to REG 2 by the upper S112 which occurred previously in time by one-half the period of the 22 Megahertz clock cycle relative to the data sample presented directly to REG 1 from flip-flop FF1. Consequently, REG 1 and REG 2 store and shift samples of the Manchester waveform. The shift rate is equal to 22 Megahertz. With each 22 Megahertz clock cycle the Manchester waveform is sampled twice for an equivalent sampling rate of 44 Megahertz.

The approach utilized in my decoder increases the interval over which the data at each register bit output remains stable enabling the use of a sequential decoding technique for the high speed Manchester waveform. The outputs of the two shift registers are interleaved and tied to the gate array inputs to synthesize a single register of bit length M+N. In the preferred embodiment, M+N equals ten bits.

The Manchester waveform is analyzed, as it propagates through the combined shift register, by selected register tap points. These tap points result in a waveform window to discriminate against waveform anomalies. These anomalies include bit rates other than the specified information channel bit rate and asymmetries within the Manchester waveform itself. Such an asymmetry might be, for example, a Manchester logic one having a period which is too long or too short.

Figure 3:
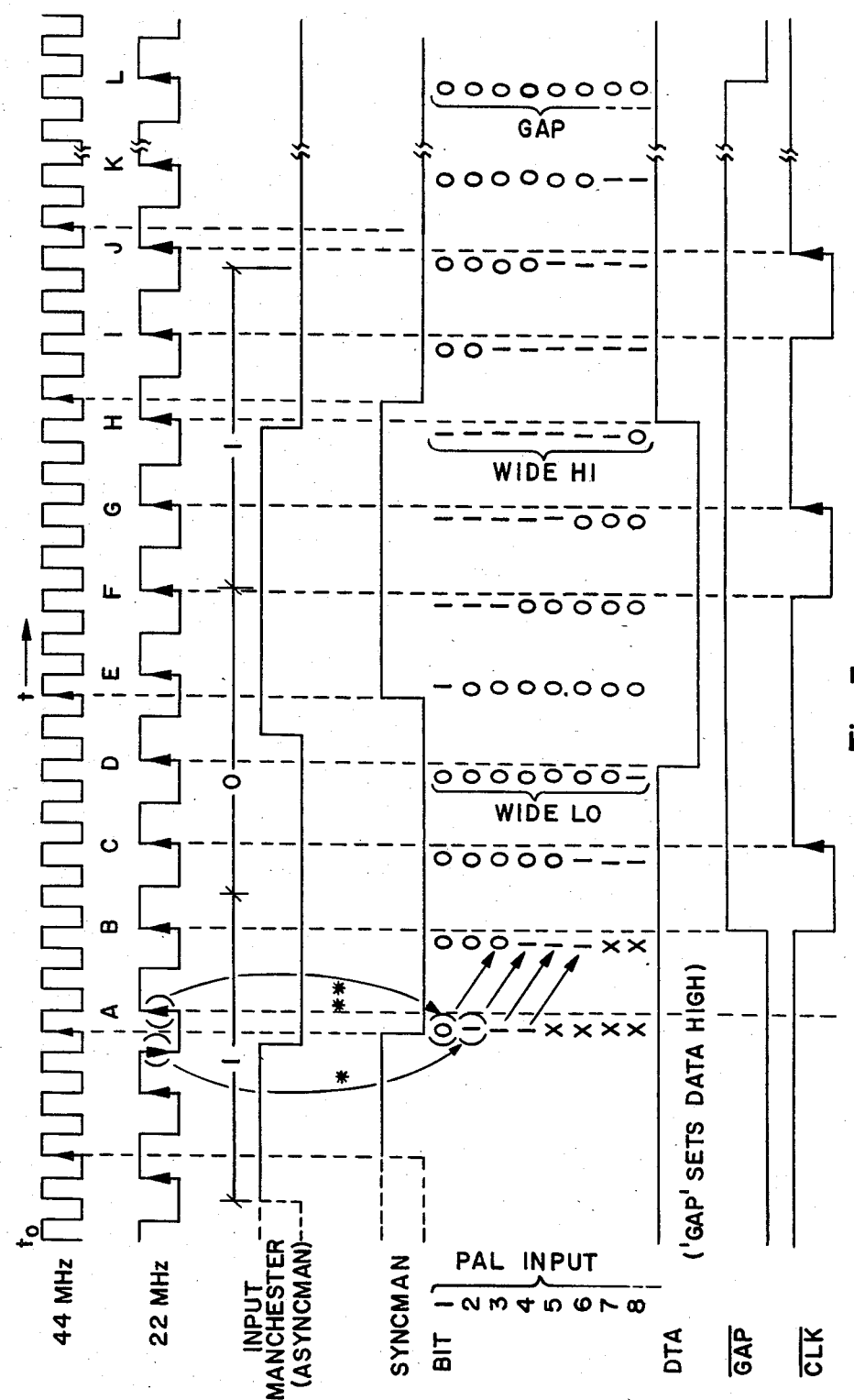
FIG. 3 is a timing diagram having a series of waveforms which illustrate the operation of the preferred embodiment.

As previously indicated, latches with output pins 5, 6, 9, 16 and 12 of the right 54F374 chip (FIG. 2) are used as gate array output latches. In the gate array (16L8 chip), certain Boolean expressions sequentially recover, from the profile of the Manchester waveform, discrete data, clock and gap signals (FIG. 3). Other Boolean expressions, in response to a diagnostic self-test command signal applied at pin 18 of the right hand 54F374, exercise the entire decoder enabling a circuit end-to-end diagnostic test. Pin 5 of the right hand 54F374 is connected to pin 10 of the upper S74 flip-flop and pin 6 of the right hand 54F374 is connected to pin 13 of the upper S74 flip-flop, enabling this end-to-end test. When a low signal is applied to pin 18 of the right 54F374, that low signal is synchronized to the 22 Megahertz clock and the latch at pin 19 for the same chip is provided as an input to pin 1 of the 16L8 chip. Boolean expressions within the gate array enable pins 14 and 17 of the 16L8 chip. The signals on these pins pass through the output latch (portion of right 54F374) to provide feedback control to the upper S74 flip-flop through pins 10 and 13 thereof.

When the diagnostic function is selected the state machine alternately takes pin 10 and pin 13 of the upper S74 low to synthesize an incoming Manchester 1010 . . . waveform pattern. The absence of a gap condition is detected by the 16L8 chip and the gap signal is taken high. The clock signal occurs at the mid-point of each bit time in the Manchester waveform, as determined by the logic levels at the register taps. Releasing the diagnostic self-test control input returns the gap, data and clock sigals to their quiescent states.

Table I set forth hereafter is a listing of the signal names assigned to the pins of the 16L8 chip:

TABLE I

| LST | Q11 | Q5 | Q1 | Q3 |
|---|---|---|---|---|
| PIN 1 | PIN 2 | PIN 3 | PIN 4 | PIN 5 |
| Q4 | Q2 | Q6 | Q8 | GND |
| PIN 6 | PIN 7 | PIN 8 | PIN 9 | PIN 10 |
| LGAP | *AGAP | Q7 | *ASTS | *ACLK |
| PIN 11 | PIN 12 | PIN 13 | PIN 14 | PIN 15 |
| LDTA | *ASTR | Q9 | *ADTA | VCC |
| PIN 16 | PIN 17 | PIN 18 | PIN 19 | PIN 20 |

Table II set forth in FIG. 4 is a listing of the gate array register truth table.

Table III set forth hereafter is a listing of the Boolean expressions encoded into the gate array for performing the sequential recovery of the data, clock and gap signals from the Manchester waveform as well as the end-to-end diagnostic test:

TABLE III $$\overline{ADTA} = \overline{F0\emptyset} = (\overline{Q1.Q3.Q6.Q8}) + (LGAP.\overline{LDTA.Q1}) +$$

$$(LGAP.\overline{LDTA.Q3}) + (LGAP.\overline{LDTA.Q6}) + (LGAP.\overline{LDTA.Q8})$$

$$\overline{AGAP} = \overline{F01} = (\overline{Q1.Q3.Q5.Q7.Q9.Q11}) + (Q1.Q3.Q5.Q7.Q9.Q11.)$$

$$\overline{ASTS} = \overline{P01} = (\overline{LST.Q11.LGAP}) + (\overline{LST.LDTA.LGAP})$$

$$\overline{ACLK} = \overline{P03} = (\overline{LDTA.Q2.Q4}) + (LDTA.\overline{Q2}.Q4)$$

$$\overline{ASTR} = \overline{P04} = (\overline{LST.Q11.LGAP}) + (\overline{LST.LDTA.LGAP})$$

When the 16L8 chip, through the use of Boolean expressions makes decisions, it assumes one of several states. Each of these states corresponds to a function. FIG. 5 is a state diagram illustrating the decision making sequence of the gate array through the use of the Boolean expressions. In the center of FIG. 5 is a truth table assigning state numbers to various combinations of the three output signals, namely, gap, data and clock. The quiescent state is state 3. That is the state assumed when there is no incoming Manchester waveform to decode. Each of the arrows in the diagram of FIG. 5 has a label indicating the requirements to move between states in the direction of the arrow indicated. Between each pair of positive edges of the 22 Megahertz clock signal, the state machine makes decisions based on the Boolean expressions in response to the combination of the current states of the output latches and the states of the tap points of the shift registers. The tap points are the Q outputs of the shift registers. The notation "ST'" in FIG. 5 refers to the self test diagnostic input.

With the arrival of a Manchester waveform, assuming that the first data bit is a logic one, the state machine exits state 3 and arrives at state 7. The machine waits at state 7 until the detection of the mid-point of each bit time in the Manchester waveform, as determined by the logic levels at the register taps, at which time it jumps to state 6 for one clock cycle of the 22 Megahertz signal. The machine immediately exits state 6 to jump back to state 7. The state machine will stay on state 7 if the succeeding Manchester data bit is a logic one and subsequentially jump back to state 6 at another mid-point of the bit time in the Manchester waveform and arrive again back at state 7. All subsequent logic ones follow the same pattern.

If the succeeding Manchester data bit is a logic zero, then the state machine goes from state 7 to state 5 and the data output is a logic zero. The state machine cycles on state 5 until the occurrence of a mid-point of the bit time in the Manchester waveform. At that time it jumps to state 4 for one clock period of the 22 Megahertz signal and returns back to state 5 thereafter. All subsequent logic zeros require the state machine to stay on state 5 and jump to state 4 for detected mid-points of the bit times in the Manchester waveform, as determined by the logic levels at the register taps, and then back to state 5 again.

Combinations of ones and zeros require the state machine to make transistions from state 5 to state 7 and back again and respond detected mid-points. When the state machine, whether on state 5 or state 7, detects the end of the Manchester waveform, it jumps to state 3, the quiescent state. If the encoded Manchester waveform data is 1100, the state machine goes from state 3 to state 7, then to state 6, then back to state 7, then back to state 6, then back to state 7 and then to state 5. Then it goes from state 5 to state 4, then back to state 5, and then back to state 4 and back to state 5. If that is the end of the transmission, it jumps back to state 3. A transition from either state 5 or 7 to state 3 requires the gap signal to go low.

When the diagnostics function is enabled, the state machine immediately exits state 3 to alternately jump first to state 7 then state 5 then back in response to the synthesized 1010 . . . Manchester waveform propagating through the M+N register. The state machine responds with an appropriate state 5 to 4 or state 7 to 6 jump with the detection of the mid-point of each bit time in the Manchester waveform as determined by the logic levels at the register taps. Releasing the diagnostics self-test input permits a state 5 or state 7 to return to state 3.

Having described a preferred embodiment of my high-speed sequential serial Manchester decoder, it should be apparent to those skilled in the art that my invention may be modified in arrangement and detail. Therefore, the protection afforded my invention should be limited only in accordance with the scope of the following claims.

I claim:

1. An apparatus for decoding bi-state data bits and clock signals encoded as a serial Manchester encoded signal comprising:

synchronizing means for synchronizing an input signal corresponding to a serial Manchester encoded signal to a reference clock signal of a frequency $f_o$ and providing a bi-state synchronized signal;

clocking means responsive to said reference clock signal for providing a divided clock signal of a frequency $f_o/2$;

delay means responsive to said divided clock signal for sampling the state of said synchronized signal and providing a bi-state delay signal corresponding in state to the state of said synchronized signal delayed by one-half the period of a divided clock signal cycle;

register means responsive to said divided clock signal for sampling the state of said synchronized signal and for serially shifting each synchronized signal sample through a first plurality of register segments of bit length M, and for sampling the state of said delay signal and for serially shifting each delay signal sample through a second plurality of register segments of bit length N, each register segment in said first and second plurality of register segments having tap means for providing an output of the sample therein, wherein said first plurality of register segments tap means and said second plurality of register segments tap means are interleaved in a predetermined order so as to provide an output sequence of synchronized signal samples and delay signal samples taken at a rate of $f_o/2$ which represent a contiguous series of samples of said synchronized signal taken at a rate of $f_o$; and state machine means for sequentially recovering bi-state data bits and clock signals from the state of the samples in said output sequence of synchronized signal samples and delay signal samples, said state machine means comprising:

(a) combinational logic means for receiving said output sequence of synchronized signal samples and delay signal samples and for performing predetermined boolean logic operations on said output sequence of synchronized signal samples and delay signal samples so as to provide, contemporaneously, a plurality of different sequences of bi-state logic signals;

(b) memory means for receiving said different sequences at bi-state logic signals and said divided clock signal, for temporarily storing each logic signal in each sequence of bi-state logic signals for a divided clock signal period and for providing a first sequence of bi-state logic signals in said sequences of bi-state logic signals as data bits and a second sequence of bi-state logic signals in said sequences of bi-state logic signals as clock signals; and (c) feedback means coupled between said combinational logic means and said memory means for providing said first sequence of bi-state logic signals from said memory means to said combinational logic means, wherein said combinational logic means performs said predetermined boolean logic operations on a previously occuring one of said bi-state logic signals in said first sequence of bi-state logic signals in conjunction with a present collection of synchronized signal samples and delay signal samples in said output sequence of synchronized signal samples and delay signal samples as provided to said combinational logic means from said register means so as to provide a next bi-state logic signal in each of said sequences of bi-state logic signals.

2. The apparatus of claim 1 wherein said synchronizing means includes oscillator means for generating said reference clock signal of a frequency $f_o$.

3. The apparatus of claim 1 wherein said state machine means recovers gap signals from the state of the samples in said output sequence of synchronized signal samples and delay signal samples, wherein said memory means provides a third sequence of bi-state logic signals in said sequences of bi-state logic signals as gap signals, said feedback means providing said third sequence of logic signals to said combinational logic means such that said combinational logic means performs said predetermined boolean logic operations on a previously occuring one of said bi-state logic signals in each of said first and third sequence of bi-state logic signals in conjunction with a present collection of synchronized signal samples and delay signal samples in said output sequence of synchronized signal samples and delay signal samples as provided to said combinational logic means from said register means so as to provide a next bi-state logic signal in each of said sequences of bi-state logic signals.

4. The apparatus of claim 1 further comprising converting means for converting a bipolar Manchester encoded signal into a unipolar input signal.

5. The apparatus of claim 1 wherein said synchronizing means comprises a flip-flop having a data input coupled to receive said input serial Manchester encoded signal, a clock input coupled to receive said reference clock signal, and an output coupled to said register means and said delay means.

6. The apparatus of claim 1 wherein said clocking means comprises a flip-flop having an input coupled to receive said reference clock signal and an output coupled to said delay means and said register means.

7. The apparatus of claim 1 wherein said delay means comprises a flip-flop having a data input coupled to said synchronizing means, a clock input coupled to said clocking means and an output coupled to said register means.

8. The apparatus of claim 1 wherein said register means comprises a plurality of flip-flops interconnected as a shift register of M+N bit length, each flip-flop in said shift register having an output coupled to said state machine means.

9. The apparatus of claim 8 wherein said state machine means comprises:
a gate array having a plurality of gate array inputs and gate array outputs, certain ones of said plurality of gate array inputs each coupled to a different predetermined flip-flop output; and
an output latch having a plurality of latch inputs and latch outputs, certain ones of said plurality of latch inputs each coupled to a different gate array output, another certain one of said plurality of latch inputs coupled to said clocking means and certain ones of said plurality of latch outputs coupled to other certain ones of said plurality of gate array inputs.

10. The apparatus of claim 1 wherein said state machine means comprises:
a gate array having a plurality of gate array inputs and a plurality of gate array outputs, certain ones of said plurality of gate array inputs each coupled to a different predetermined register tap means; and
an output latch having a plurality of latch inputs and a plurality of latch outputs, certain ones of said plurality of latch inputs each coupled to a different gate array output, another certain one of said plurality of latch inputs coupled to said clocking means and certain ones of said plurality of latch outputs coupled to other certain ones of said plurality of gate array inputs.

11. The apparatus of claim 1 further comprising test means for selectively performing an end-to-end diagnostic test of the apparatus.

12. The apparatus of claim 11 wherein said test means includes feedback means for providing feedback to said synchronizing means from said state machine means.

13. An apparatus for decoding bi-state data bits and clock signals encoded as a bipolar serial Manchester encoded signal comprising:
converting means for converting a bipolar serial Manchester encoded signal into a corresponding unipolar input signal;
oscillator means for generating a reference clock signal of a frequency $f_o$;
clocking means responsive to said reference clock signal for providing a divided clock signal of a frequency $f_o/2$;
synchronizing means for synchronizing said input signal to said reference clock signal and providing a bi-state synchronized signal;
delay means responsive to said divided clock signal for sampling the state of said synchronized signal and providing a bi-state delay signal corresponding in state to the state of said synchronized signal delayed by one-half the period of a divided clock signal cycle;
first register means responsive to said divided clock signal for sampling the state of said synchronized signal and for serially shifting each synchronized signal sample through M register segments wherein each of said M register segments provides an output of the synchronized signal sample therein;

second register means responsive to said divided clock signal for sampling the state of said delay signal and for serially shifting each delay signal sample through N register segments wherein each of said N register segments provides an output of the delay signal sample therein, and wherein said M and N register segments outputs are intereleaved in a predetermined order so as to synthesize a single register of M+N bit length and provide an output sequence of synchronized signal samples and delay signal samples taken at a rate of $f_o/2$ which represent a contiguous series of samples of said synchronized signal taken at a rate of $f_o$; and state machine means for receiving said output sequence of synchronized signal samples and delay signal samples along with said divided clock signal and for sequentially recovering bi-state data bits, clock signals and gap signals from the state of the samples in said output sequence of synchronized signal samples and delay signal samples, said state machine means comprising;

(a) combinational logic means for receiving said output sequence of synchronized signal samples and delay signal samples and for performing predetermined boolean logic operations on said output sequence of synchronized signal samples and delay signal samples so as to provide, contemporaneously, a plurality of different sequences of bi-state logic signals;

(b) memory means for receiving said different sequences of bi-state logic signals and said divided clock signal, for temporarily storing each logic signal in each sequence of bi-state logic signals for a divided clock signal period and for providing a first sequence of bi-state logic signals in said sequences of bi-state logic signals as data bits, a second sequence of bi-state logic signals in said sequences of bi-state logic signals as clock signals and a third sequence of bi-state logic signals in said sequences of bi-state logic signals as gap signals; and (c) feedback means coupled between said combinational logic means and said memory means for providing said first and third sequences of bi-state logic signals from said memory means to said combinational logic means, wherein said combinational logic means performs said predetermined boolean logic operations on a previously occuring one of said bi-state logic signals in each of said first and third sequences of bi-state logic signals in conjunction with a present collection of synchronized signal samples and delay signal samples in said output sequence of synchronized signal samples and delay signal samples as provided to said combinational logic means from said register means so as to provide a next bi-state logic signal in each of said sequences of bi-state logic signals.

14. The apparatus of claim 13 wherein said converting means comprises:

transformer means responsive to a bipolar Manchester signal for providing an inductively coupled transformer signal corresponding to said bipolar Manchester signal;

amplifying means for amplifying said transformer signal and providing a pair of amplifier output signals, one of said amplifier output signals being the complement of the other one of said amplifier output signals; and flip-flop means for converting said pair of complementary output signals into a single-ended TTL compatible input signal.

15. The apparatus of claim 13 wherein said oscillator means comprises a stable crystal oscillator having an output coupled to said synchronizing means and said clocking means.

16. The apparatus of claim 15 wherein said clocking means comprises a first J/K type flip-flop having an input coupled to said oscillator output and an output coupled to said delay means, said first register means, said second register means and state machine means.

17. The apparatus of claim 16 wherein said synchronizing means comprises a D type flip-flop having a pair of inputs, each respectively coupled to said oscillator output and said converting means, and a pair of outputs, each respectively coupled to said delay means and said first register means.

18. The apparatus of claim 17 wherein said delay means comprises a second J/K type flip-flop having a plurality of inputs, a pair of said plurality of second J/K type flip-flop inputs each respectively coupled to said pair of D type flip-flop outputs, another input of said plurality of inputs coupled to said first J/K type flip-flop output and an output coupled to said second register means.

19. The apparatus of claim 18 wherein said first and second register means each comprise a plurality of flip-flops interconnected as a shift register with each shift register flip-flop having an output coupled to said state machine means, said first register means shift register having M flip-flops and said second register means shift register having N flip-flops.

20. The apparatus of claim 19 wherein said state machine means comprises:

a gate array having a plurality of gate array inputs and a plurality of gate array outputs, certain ones of said plurality of gate array inputs each coupled to a different predetermined output of said M and N register segments; and an output latch having a plurality of latch inputs and a plurality of latch outputs, certain ones of said plurality of latch inputs each coupled to a different gate array output, another certain one of said plurality of latch inputs coupled to said first J/K type flip-flop output and certain ones of said plurality of latch outputs coupled to other certain ones of said plurality of gate array inputs.

21. The apparatus in claim 19 further comprising test means responsive to a test command signal for selectively performing an end-to-end diagnostic test of the apparatus, said test means including feedback means for providing feedback control from said output latch to said D type flip-flop.

* * * * *